(12) United States Patent
Sugita et al.

(10) Patent No.: US 12,403,433 B2
(45) Date of Patent: Sep. 2, 2025

(54) DILUTE CHEMICAL SOLUTION PRODUCTION DEVICE

(71) Applicant: KURITA WATER INDUSTRIES LTD., Tokyo (JP)

(72) Inventors: Wataru Sugita, Tokyo (JP); Yuichi Ogawa, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 978 days.

(21) Appl. No.: 17/436,653

(22) PCT Filed: Feb. 18, 2020

(86) PCT No.: PCT/JP2020/006171
§ 371 (c)(1),
(2) Date: Sep. 6, 2021

(87) PCT Pub. No.: WO2020/195341
PCT Pub. Date: Oct. 1, 2020

(65) Prior Publication Data
US 2022/0184571 A1 Jun. 16, 2022

(30) Foreign Application Priority Data
Mar. 28, 2019 (JP) .................................. 2019-063574

(51) Int. Cl.
*B01F 35/22* (2022.01)
*B01F 23/40* (2022.01)
(Continued)

(52) U.S. Cl.
CPC .......... *B01F 35/2202* (2022.01); *B01F 23/49* (2022.01); *B01F 25/00* (2022.01);
(Continued)

(58) Field of Classification Search
CPC ...... B01F 35/2202; B01F 23/49; B01F 25/00; B01F 35/2133; B01F 35/717613;
(Continued)

(56) References Cited

U.S. PATENT DOCUMENTS 5,522,660 A * 6/1996 O'Dougherty .......... B01F 25/51
366/136
6,146,008 A * 11/2000 Laederich .............. G05D 21/02
366/136
(Continued)

FOREIGN PATENT DOCUMENTS

JP   S59218731   12/1984
JP   2000265945    9/2000
(Continued)

OTHER PUBLICATIONS

Office Action of Taiwan Counterpart Application, with English translation thereof, issued on Aug. 22, 2023, pp. 1-19.
(Continued)

*Primary Examiner* — Charles Cooley
(74) *Attorney, Agent, or Firm* — JCIPRNET

(57) ABSTRACT

Dilute chemical solution production device (1) has a plunger pump and a chemical solution supply pipe (3) that supply a chemical solution S from a chemical solution reservoir. The end of the chemical solution supply pipe (3) serves as an injection point 11 for the chemical solution (S). The chemical solution supply pipe (3) is inserted to an approximately central position in the radial direction of an ultrapure water passage (12), which is a first pipe, via a bore-through joint (13). Conductivity meter (14) as a conductivity measuring meter is provided on the downstream side of the bore-through joint (13), which serves as the injection point (11),
(Continued)

and is connected to a controller so that the plunger pump (4) can be controlled in accordance with the measured value of the conductivity meter (14).

7 Claims, 7 Drawing Sheets

(51) Int. Cl.
| | | |
|---|---|---|
| *B01F 25/00* | (2022.01) | |
| *B01F 35/21* | (2022.01) | |
| *B01F 35/71* | (2022.01) | |
| *B01F 101/58* | (2022.01) | |
| *C11D 7/04* | (2006.01) | |
| *H01L 21/67* | (2006.01) | |

(52) U.S. Cl.
CPC .. *B01F 35/2133* (2022.01); *B01F 35/717613* (2022.01); *C11D 7/04* (2013.01); *H01L 21/67051* (2013.01); *B01F 2101/58* (2022.01); *C11D 2111/22* (2024.01)

(58) Field of Classification Search
CPC B01F 2101/58; B01F 35/2113; B01F 23/451; B01F 35/80; B01F 23/40; B01F 21/00; B01F 35/20; B01F 35/211; B01F 35/7176; C11D 7/04; C11D 2111/22; H01L 21/67051; H01L 21/304
USPC ...................................................... 366/152.4
See application file for complete search history.

(56) References Cited

U.S. PATENT DOCUMENTS

| | | | | |
|---|---|---|---|---|
| 6,247,838 | B1* | 6/2001 | Pozniak | B01F 23/405 366/136 |
| 6,588,927 | B2* | 7/2003 | Nakagawa | B01F 23/49 366/152.3 |
| 6,623,183 | B2* | 9/2003 | Nakagawa | G03D 3/00 396/626 |
| 6,764,212 | B1* | 7/2004 | Nitta | F16K 7/123 366/160.2 |
| 6,796,703 | B2* | 9/2004 | Lemke | G05D 11/135 366/152.4 |
| 7,063,455 | B2* | 6/2006 | Achkire | H01L 21/67253 366/152.2 |
| 7,419,946 | B2* | 9/2008 | Hiraoka | B24B 57/02 438/692 |
| 10,406,493 | B2* | 9/2019 | Hayashi | B01F 25/31 |
| 2002/0034122 | A1* | 3/2002 | Lemke | B24B 37/04 366/136 |
| 2002/0136087 | A1* | 9/2002 | Nakagawa | B01F 35/2132 366/153.1 |
| 2007/0212261 | A1* | 9/2007 | Tanaka | G01F 23/56 422/67 |
| 2017/0259234 | A1* | 9/2017 | Hayashi | B01F 35/831 |
| 2019/0388857 | A1 | 12/2019 | Hayashi et al. | |
| 2020/0016549 | A1 | 1/2020 | Anzai et al. | |
| 2020/0045207 | A1 | 2/2020 | Morovic et al. | |
| 2020/0131022 | A1* | 4/2020 | Sasaki | B67D 7/70 |

FOREIGN PATENT DOCUMENTS

| | | | |
|---|---|---|---|
| JP | 2019107601 | 7/2019 | |
| TW | 201721322 | 6/2017 | |
| WO | 2016042933 | 3/2016 | |
| WO | 2018116987 | 6/2018 | |
| WO | 2018225278 | 12/2018 | |
| WO | WO-2020195341 A1 * | 10/2020 | ............. B01F 23/49 |

OTHER PUBLICATIONS

"Office Action of Japan Counterpart Application" with English translation thereof, issued on Sep. 8, 2020, p. 1-p. 8.

"International Search Report (Form PCT/ISA/210) of PCT/JP2020/006171", mailed on Apr. 7, 2020, with English translation thereof, pp. 1-4.

* cited by examiner

DILUTE CHEMICAL SOLUTION PRODUCTION DEVICE

CROSS-REFERENCE TO RELATED APPLICATION

This application is a 371 application of the International PCT application serial no. PCT/JP2020/006171, filed on Feb. 18, 2020, which claims the priority benefit of Japan Patent Application no. 2019-063574, filed on Mar. 28, 2019. The entirety of each of the above mentioned patent applications is hereby incorporated by reference herein and made a part of this specification.

TECHNICAL FIELD

The present invention relates to a device for producing a dilute chemical solution and particularly to a dilute chemical solution production device capable of producing, with a simple structure, a dilute chemical solution having an extremely low concentration of acid/alkali and effective in a washing/rinsing step or the like for semiconductor wafers and other similar components.

BACKGROUND ART

In the production processes for semiconductor wafers and liquid crystals, the semiconductor wafers and glass substrates are washed using ultrapure water from which impurities are removed at a high level.

In such washing of semiconductor wafers using ultrapure water, static electricity is likely to be generated because the ultrapure water has a high specific resistance value, which may lead to electrostatic destruction of insulating films and reattachment of fine particles. One approach to this is the use of water in which a solute effective for control of the pH or redox potential is dissolved at a very low concentration (such water will be referred to as a dilute chemical solution, hereinafter). Here, one or more gases such as $H_2$, $CO_2$, $O_3$, and $NH_3$ may also be dissolved, but the device will be complicated to dissolve the gases. Accordingly, it is performed to add a slight amount of a chemical solution such as a minimum necessary acid or alkali or an oxidant or reductant to ultrapure water so that the ultrapure water has a pH or redox potential suitable for the intended use for the washing, rinsing, and the like.

Devices used to add a slight amount of a chemical solution to ultrapure water include a device for diluting the chemical solution with ultrapure water to the middle of a desired concentration to prepare a diluted chemical solution and adding the diluted chemical solution further to ultrapure water to obtain a dilute chemical solution. As illustrated in FIG. 6, this dilute chemical solution production device has: a diluted chemical solution reservoir 21 and a chemical solution reservoir 22; a chemical solution supply pipe 23 provided with a liquid transfer pump 24 that supplies a chemical solution S from the chemical solution reservoir 22; a supply means 25 and a diluting liquid supply pipe 26 for ultrapure water W that is the diluting liquid; and a diluted chemical solution supply pipe 27 provided with a diaphragm pump 28 that communicates between the diluted chemical solution reservoir 21 and an injection point 29 into an ultrapure water flow path. As illustrated in FIG. 7, the diluted chemical solution supply pipe 27 communicates with the ultrapure water flow path 31 at a joint pipe 32 that serves as the injection point 29. Reference numeral 33 denotes an on-off valve.

In such a conventional dilute chemical solution production device, the chemical solution S and the ultrapure water W are supplied to the diluted chemical solution reservoir 21 to produce a diluted chemical solution S0 obtained by diluting the chemical solution S to some extent, and the diluted chemical solution S0 is supplied into the ultrapure water flow path 31 thereby to be further diluted for preparing a dilute chemical solution S1. This dilute chemical solution production device, however, requires both a device for producing the diluted chemical solution and a device for adding the diluted chemical solution to ultrapure water and thus involves a problem in that not only the installation location is limited but also the cost increases.

Such a problem may be solved through adding a slight amount of the chemical solution (undiluted solution) directly to ultrapure water to prepare the dilute chemical solution and thus reducing the number of components of the device to make the device more compact, but in this case another problem may arise in that it is difficult to stably supply a slight amount of the chemical solution when adding an extremely slight amount of the undiluted solution S to ultrapure water without any processing. To solve such a problem, Patent Document 1 proposes a device that prepares a dilute chemical solution through controlling the pressure in a tank for storing the chemical solution using $N_2$ gas or the like and pushing out the chemical solution little by little by that pressure to directly supply the chemical solution to ultrapure water.

PRIOR ART DOCUMENT

Patent Document

[Patent Document 1] WO2016/042933

SUMMARY OF THE INVENTION

Problems to be Solved by the Invention

However, the above dilute chemical solution production device described in Patent Document 1 is configured to control the pressure in the tank for storing the chemical solution and push out a slight amount of the chemical solution by that pressure to supply the chemical solution and therefore involves a problem in that the device structure becomes complicated because it is necessary to measure the flow rate of ultrapure water, the concentration of the chemical solution, and the pressure in the tank for storing the chemical solution and finely control the pressure so that the concentration of the dilute chemical solution becomes a predetermined value. In addition, the dilute chemical solution production device described in Patent Document 1 can accurately supply the chemical solution to ultrapure water, but there is a problem in uniform dispersion of the supplied chemical solution in the ultrapure water.

The present invention has been made in view of the above-described problems, and an object of the present invention is to provide a dilute chemical solution production device capable of producing, with a simple structure, a dilute chemical solution having an extremely low concentration of acid/alkali or the like.

Means for Solving the Problems

To achieve the above object, the present invention provides a dilute chemical solution production device that produces a dilute chemical solution of a second liquid by adding the second liquid to a first liquid, the dilute chemical solution production device comprising: a first pipe that flows the first liquid; an undiluted solution tank that stores the second liquid; a second pipe that connects the undiluted solution tank and the first pipe; a pump that adds the second liquid into the first pipe through the second pipe; a conductivity measuring means provided on a downstream side of a connection site between the first pipe and the second pipe with respect to a flow direction of the first liquid; and a control means that controls the pump based on a measured value of the conductivity measuring means (Invention 1).

According to the invention (Invention 1), the concentration of the dilute chemical solution of the second liquid can be estimated by measuring the conductivity on the downstream side of the connection site between the first pipe and the second pipe, which is the site where the second liquid is added to the first liquid, and therefore the injection amount of the second liquid can be controlled based on the conductivity thereby to supply the dilute chemical solution in which the second liquid is stabilized at a desired concentration.

In the above invention (Invention 1), the tip of the second pipe may be preferably connected in a state of being inserted to an approximately central position with respect to the inner diameter of the first pipe (Invention 2).

The first liquid flows in a laminar flow state in the pipe, and the second liquid is therefore likely to be unevenly distributed in the first liquid if the additive amount of the second liquid, which is the chemical solution, is a slight amount. According to the invention (Invention 2), the tip of second pipe having a small diameter is inserted to the approximately central position with respect to the inner diameter of the first pipe, and the second liquid can thereby be uniformly dispersed in the first pipe.

In the above invention (Invention 1, 2), the first pipe may be preferably provided with a first bent portion in the vicinity of the connection site with the second pipe (Invention 3).

According to the invention (Invention 3), the bent portion is provided in the vicinity of the connection site between the first pipe and the second pipe, which is the site where the second liquid is added to the first liquid, and the first liquid thereby becomes a turbulent flow state; therefore, the second liquid can diffuse well into the first liquid, and a more homogeneous dilute chemical solution can be produced.

In the above invention (Invention 3), the first pipe may be preferably provided with a second bent portion between the first bent portion and the conductivity measuring means, and the distance between the first bent portion and the second bent portion may be preferably 20 to 50 cm (Invention 4).

According to the invention (Invention 4), the second bent portion is provided at a site of 20 to 50 cm from the first bent portion and before the conductivity measuring means, and the mixed solution of the first liquid and the second liquid thereby becomes a turbulent flow state; therefore, the diffusion of the second liquid into the first liquid becomes better, and the injection amount of the second liquid based on the measured value of the conductivity measuring means can be controlled more accurately.

In the above invention (Invention 1 to 4), the distance between the connection site of the second pipe in the first pipe and the conductivity measuring means may be preferably 30 to 70 cm (Invention 5).

According to the invention (Invention 5), the conductivity measuring means is provided at a position of 30 to 70 cm from the site where the second liquid is added to the first liquid, and the response time in the control of the pump can be shortened; therefore, the concentration of the dilute chemical solution can be appropriately controlled.

In the above invention (Invention 1 to 5), the first liquid may be preferably ultrapure water and the second liquid may preferably contain ammonia (Invention 6).

According to the invention (Invention 6), by using a highly pure dilute ammonia solution, it can be suitably applied to processing such as washing of semiconductor wafers.

Advantageous Effect of the Invention

According to the present invention, the conductivity is measured on the downstream side of the connection site between the first pipe and the second pipe, which is the site where the second liquid is added to the first liquid, and the injection amount of the second liquid can be controlled based on the conductivity; therefore, the dilute chemical solution in which the second liquid is stabilized at a desired concentration can be produced.

EMBODIMENTS FOR CARRYING OUT THE INVENTION

Figure 1:
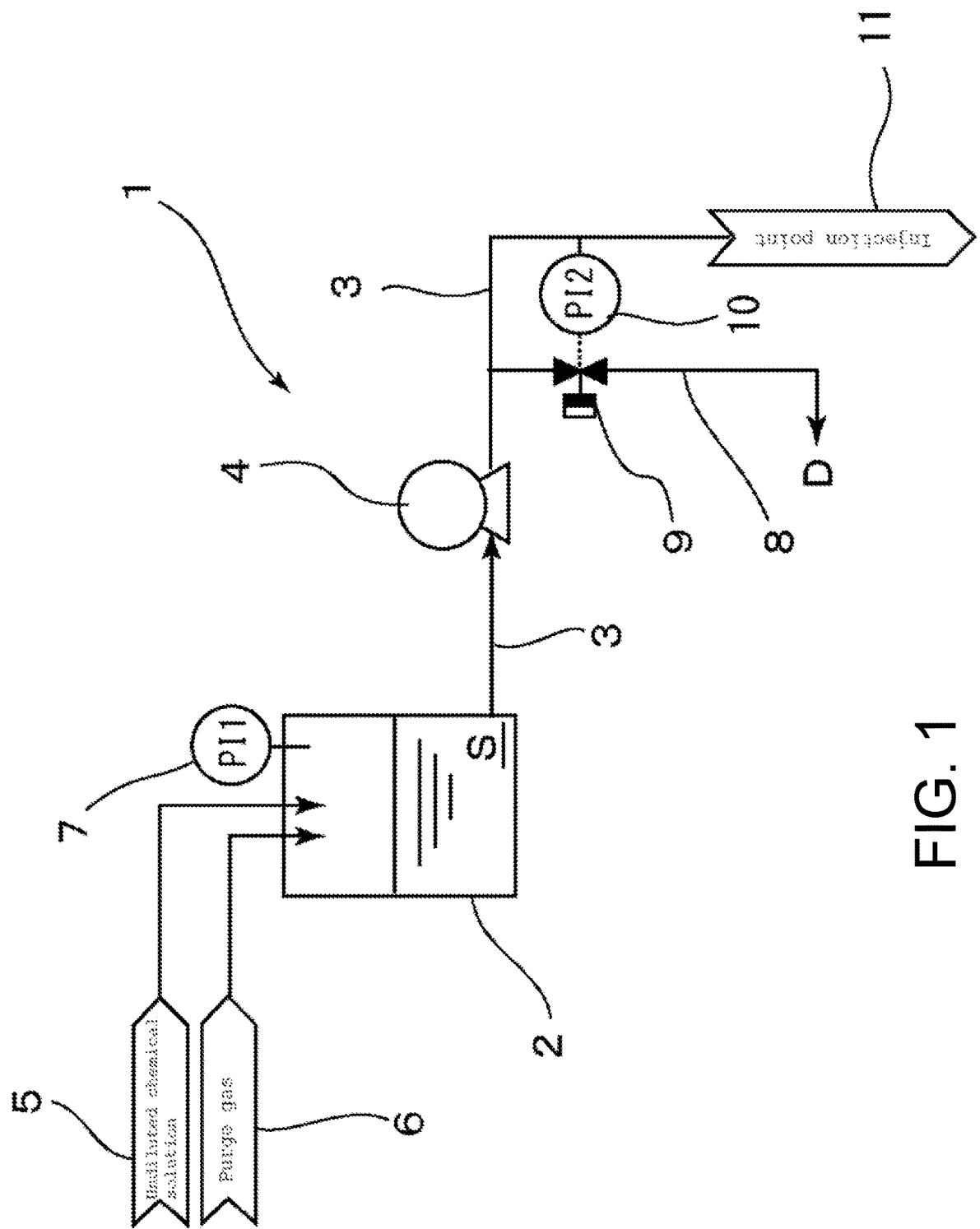
FIG. 1 is a flow diagram illustrating a dilute chemical solution production device according to a first embodiment of the present invention.
Figure 2:
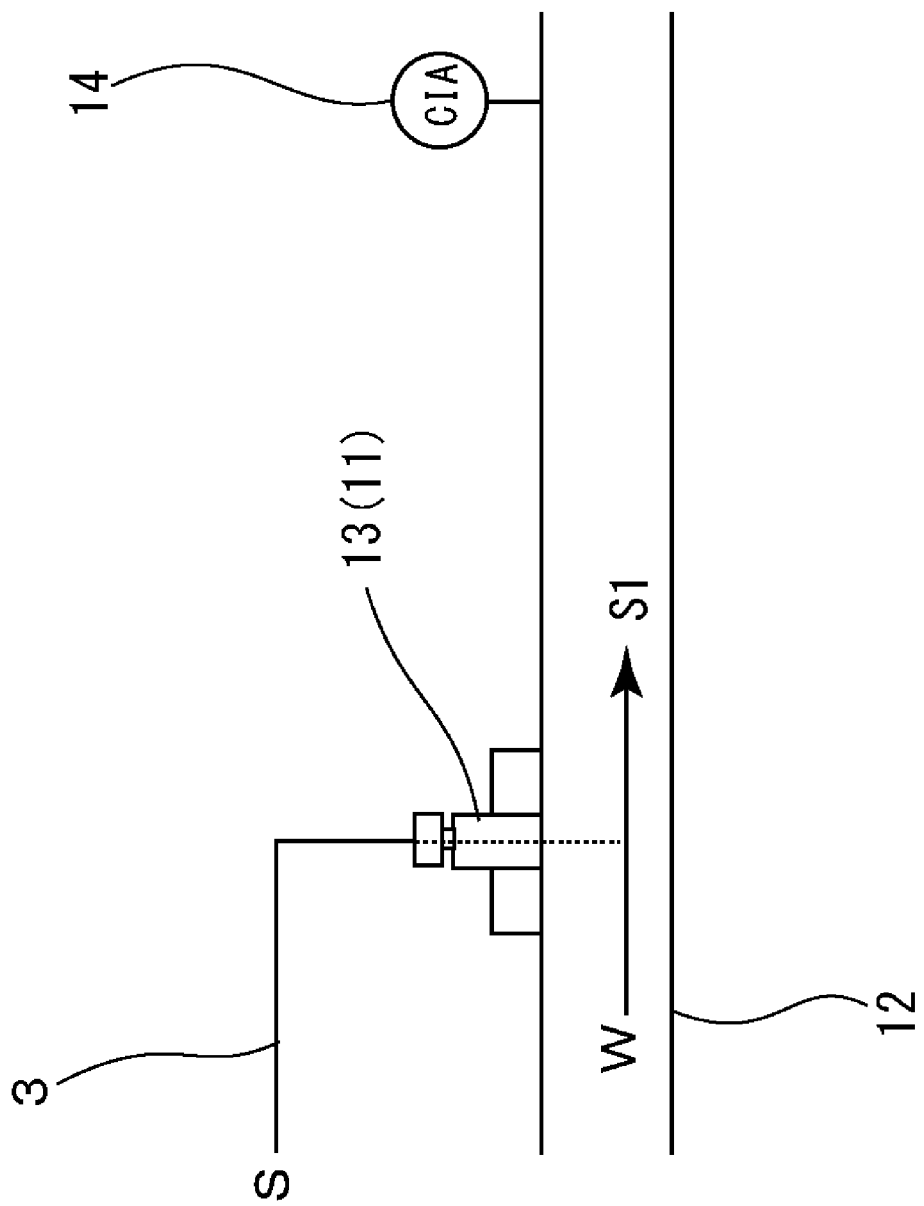
FIG. 2 is a schematic diagram illustrating an injection structure for the second liquid in the dilute chemical solution production device according to the first embodiment.

FIGS. 1 and 2 illustrate a dilute chemical solution production device according to the first embodiment of the present invention. In FIG. 1, the dilute chemical solution production device 1 has a chemical solution reservoir 2, which is the undiluted solution tank, a plunger pump 4 as the pump for supplying a chemical solution S, which is the second liquid, from the chemical solution reservoir 2, and a chemical solution supply pipe 3, which is the second pipe. The chemical solution reservoir 2 communicates with a chemical solution supply means 5 for replenishing the chemical solution reservoir 2 with an ammonia solution (undiluted solution), which is the chemical solution S, and a purge gas supply means 6 for supplying $N_2$ gas, which is an inert gas, to the chemical solution reservoir 2 as a purge gas and is provided with a first pressure gauge 7 as a pressure measuring means. The plunger pump 4 can be controlled by a controller, referring to element 18 shown in FIG. 4, so that the supply amount varies in accordance with the flow rate in an ultrapure water flow path 12 and the measured value of a conductivity meter 14. The ultrapure water flow path 12 and the conductivity meter 14 will be described later.

A drain pipe 8 is connected to the head portion of the plunger pump 4, and the drain pipe 8 is provided with an automatically controlled air vent valve 9, which is an air vent mechanism. On the other hand, a second pressure gauge 10 as a pressure measuring means is provided in the middle of the chemical solution supply pipe 3, and the end of the chemical solution supply pipe 3 serves as an injection point 11 for the chemical solution (ammonia solution) S. The second pressure gauge 10 is connected to a control means, which is not illustrated, for controlling the air vent valve 9, and this control means controls the air vent valve 9 so that it operates when the measured pressure of the second pressure gauge 10 becomes equal to or less than a predetermined value. The injection point 11 is set such that, as illustrated in FIG. 2, the chemical solution supply pipe 3 is connected to the ultrapure water flow path 12 as the first pipe for the ultrapure water W, which is the first liquid, via a bore-through joint 13.

In the dilute chemical solution production device 1 as described above, the chemical solution supply pipe 3 may be made of a fluorine-based resin such as perfluoroalkoxy fluorine resin (PFA), and its inner diameter may be preferably 0.1 to 4 mm. If the inner diameter of the chemical solution supply pipe 3 is larger than 4 mm, the pressure gradient of the fluid flowing in the chemical solution supply pipe 3 will be unduly small because the amount of the chemical solution S supplied is a slight amount, and it will be difficult to control the flow rate. On the other hand, in the case of 0.1 mm or less, the inner diameter of the pipe will be unduly small and the pressure gradient of the fluid will be unduly large, which may not be preferred because it may rather be difficult to control the flow rate. The ultrapure water flow path 12 for the use as the first pipe may have an inner diameter of about 10 to 50 mm, particularly about 20 to 40 mm.

As illustrated in FIG. 2, the tip of the chemical solution supply pipe 3 may be preferably inserted to an approximately central position, for example, to a position of ⅓ to ⅔, particularly to a position of ⅖ to ⅗, in the radial direction of the ultrapure water flow path 12, which is the first pipe, via the bore-through joint 13 which serves as the injection point (connection site) 11. In the present embodiment, the injection amount of the chemical solution (ammonia solution) S is an extremely slight amount, and therefore if the tip of the chemical solution supply pipe 3 is located at a position less than ⅓ or more than ⅔ of the inner diameter of the ultrapure water flow path 12 in the radial direction of the ultrapure water flow path 12, it will be difficult to uniformly disperse the chemical solution (ammonia solution) S in the ultrapure water flow path 12, which may not be preferred.

The conductivity meter 14 as the conductivity measuring means is provided on the downstream side of the bore-through joint 13, which serves as the injection point 11, and is connected to the previously described control means (not illustrated) so that the plunger pump 4 can be controlled in accordance with the measured value of the conductivity meter 14. The installation position of the conductivity meter 14 may be preferably located at a position of 30 to 70 cm from the injection point (connection site) 11 because if the physical distance (distance) from the injection point (connection site) 11 is unduly large, the response time in the control of the plunger pump 4 will be long, while if the distance is unduly small, the chemical solution (ammonia solution) S will not be sufficiently homogenized and the error of the measured value by the conductivity meter may become large. The diameter of the inflow pipe of the conductivity meter 14 may be preferably small, for example, about 3 to 6 mm, and the length of the inflow pipe may be preferably as short as possible.

The description will then be directed to a method of producing a dilute chemical solution using the dilute chemical solution production device 1 of the present embodiment having the configuration as described above.

First, a predetermined amount of the chemical solution (ammonia solution) S is stored in the chemical solution reservoir 2 from the chemical solution supply means 5, and $N_2$ gas is supplied from the purge gas supply means 6. In this operation, the inside of the chemical solution reservoir 2 may be pressurized with $N_2$ gas by about 0.01 to 1 MPa with respect to the atmospheric pressure to suppress the generation of bubbles in the chemical solution S in the chemical solution reservoir 2. This pressurizing condition may be appropriately selected within the above range in accordance with the type of the chemical solution S to be used, the ambient temperature, and the temperature of the chemical solution S and may be controlled using the first pressure gauge 7. This pressurizing condition is not for supplying the chemical solution S, so accurate control in accordance with the supply amount and the like is not necessary.

Then, the chemical solution (ammonia solution) S is supplied from the chemical solution reservoir 2 to the injection point 11 by the plunger pump 4 via the chemical solution supply pipe 3. The flow pressure of the chemical solution S flowing through the chemical solution supply pipe 3 may be preferably set slightly higher than the injection pressure at the injection point 11. For example, when the injection pressure at the injection point 11 is 0.3 MPa, the flow pressure of the chemical solution S may be set to 0.31 MPa or the like. The amount of the chemical solution S supplied by the plunger pump 4 may be 0.001 to 3.0 mL/min, particularly 0.05 to 1.5 mL/min, which is an extremely slight amount, and can be controlled within the above range so that the chemical solution (ammonia solution) S has a desired concentration in accordance with the flow rate of the ultrapure water W.

Thus, in the plunger pump 4, if air bubbles are present in the chemical solution S and air is mixed in the plunger pump 4, the air bubbles will adhere to a small ball check valve of the plunger pump 4 to lose the check effect and poor injection may thereby occur. This may make it difficult to produce a dilute chemical solution of the chemical solution S having a desired concentration. To overcome such difficulty, focusing attention on the fact that the pressure of the chemical solution S discharged from the plunger pump 4 will drastically drop if air is mixed in the plunger pump 4, the flow pressure of the chemical solution S flowing through the chemical solution supply pipe 3 is measured using the second pressure gauge 10, and a determination is made that air is mixed when the flow pressure drops by about 20%, for example, when the flow pressure of the chemical solution S becomes 0.25 MPa or less in the case of setting the flow pressure to 0.31 MPa.

Then, when a determination is made that air is mixed, the control means connected to the second pressure gauge 10 is used to operate the air vent valve 9 so that the chemical solution S flows through the drain pipe 8 to discharge the air from the air vent valve 9 and also to discharge the liquid component (chemical solution S) as drain D. Thus, in the present embodiment, the air vent valve 9 is used as an automatic valve, and the air can be vented as soon as the pressure drop is detected; therefore, the injection amount of the chemical solution S can be rapidly recovered to the set value.

In this way, a predetermined amount of the chemical solution S is supplied from the chemical solution supply pipe 3 to the injection point 11. Then, the chemical solution S flows into the ultrapure water flow path 12, through which the ultrapure water W flows, via the bore-through joint 13. The flow rate of the ultrapure water W in this operation is not particularly limited, but may be, for example, about 7 to 52 L/min. In this operation, the tip of the chemical solution supply pipe 3 is inserted to an approximately central position, preferably to a position of 1/3 to 2/3, particularly preferably to a position of 2/5 to 3/5, with respect to the inner diameter of the ultrapure water flow path 12; therefore, the chemical solution S can be uniformly dispersed in the ultrapure water W in the ultrapure water flow path 12, and the dilute chemical solution S1 can be produced with a homogeneous ammonia concentration.

Then, the conductivity of the dilute chemical solution S1 of ammonia is measured using the conductivity meter 14. In this operation, the concentration of the chemical solution S can be calculated by preliminarily measuring the conductivity of the ultrapure water W; therefore, when there is a difference from a desired concentration of the chemical solution S, the plunger pump 4 may be controlled using the control means, which is not illustrated, to slightly increase or decrease the supply amount of the chemical solution (ammonia solution) S, and the concentration of ammonia in the dilute chemical solution S1 can thereby be stabilized. Such a dilute chemical solution S1 of ammonia can be suitably used for processing such as washing of semiconductor wafers.

Figure 3:
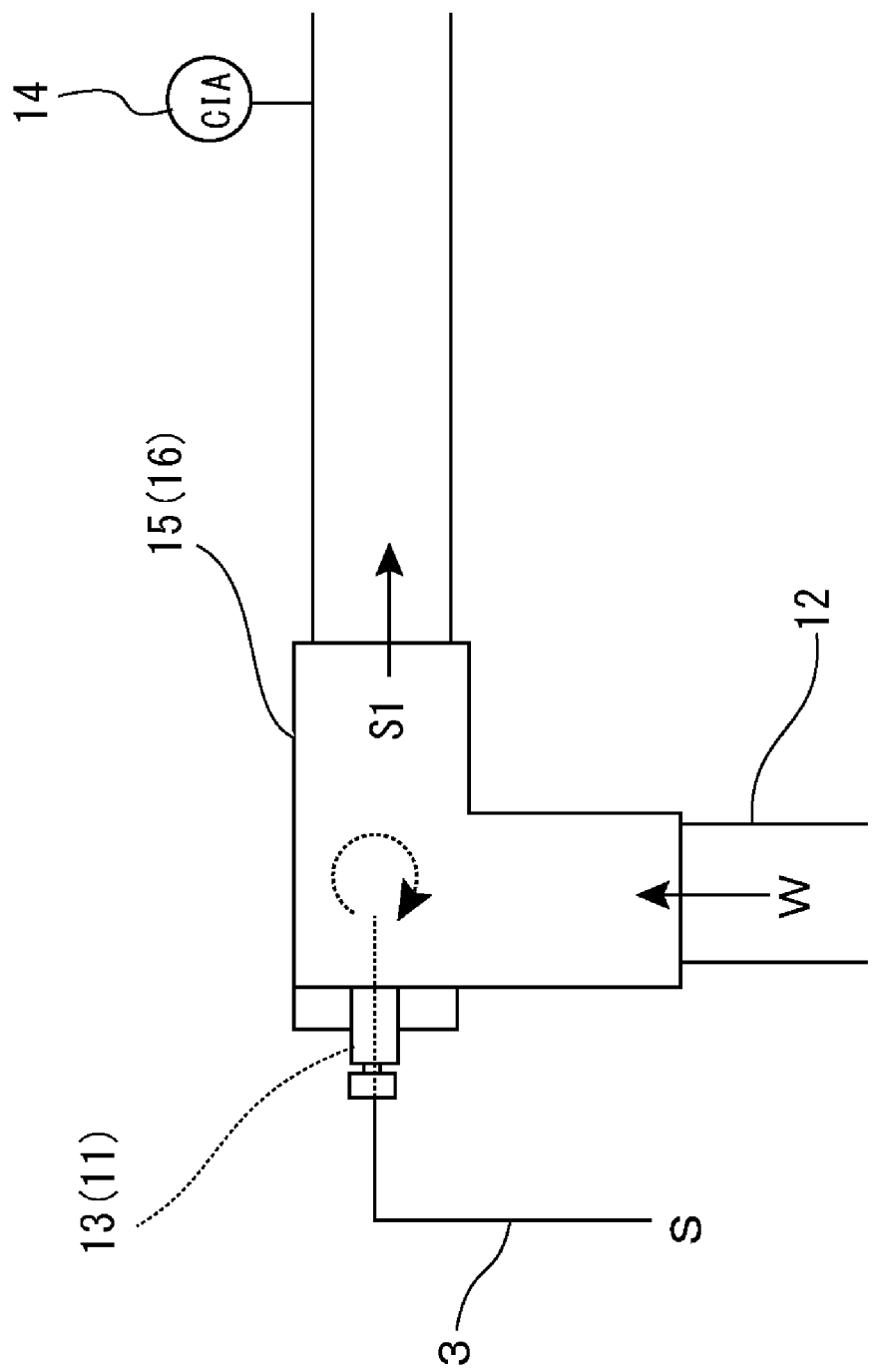
FIG. 3 is a schematic diagram illustrating an injection structure for the second liquid in the dilute chemical solution production device according to a second embodiment of the present invention.

The dilute chemical solution production device according to the second embodiment of the present invention will then be described with reference to FIG. 3. As illustrated in FIG. 3, the dilute chemical solution production device 1 of the present embodiment is configured such that the ultrapure water flow path 12 is bent, and this first bent portion 15 of the ultrapure water flow path is provided with an elbow member 16 to which the chemical solution supply pipe 3 (injection point 11) is connected via the bore-through joint 13. The tip of the chemical solution supply pipe 3 is inserted to an approximately central position, preferably to a position of 1/3 to 2/3, particularly preferably to a position of 2/5 to 3/5, with respect to the inner diameter of the ultrapure water flow path 12. The conductivity meter 14 is provided on the downstream side in the flow direction of the first bent portion 15 of the ultrapure water flow path 12.

The installation position of the conductivity meter 14 may be preferably located at a position of 30 to 70 cm from the injection point (connection site) 11 because if the physical distance (distance) from the injection point (connection site) 11 is unduly large, the response time in the control of the plunger pump 4 will be long, while if the distance is unduly small, the chemical solution (ammonia solution) S will not be sufficiently homogenized and the error of the measured value by the conductivity meter may become large. The diameter of the inflow pipe of the conductivity meter 14 may be preferably small, for example, about 3 to 6 mm, and the length of the inflow pipe may be preferably as short as possible.

The injection point 11 is disposed in the elbow member 16 constituting the first bent portion 15 of the ultrapure water flow path 12 as in the present embodiment, and the ultrapure water W is thereby in a turbulent flow state in the first bent portion 15 (elbow member 16) of the ultrapure water flow path 12; therefore, satisfactory diffusion of the chemical solution S into the ultrapure water W can be expected, and a more homogeneous dilute chemical solution S1 can be produced.

Furthermore, the dilute chemical solution production device according to the third embodiment of the present invention will be described with reference to FIG. 4. In the present embodiment, the previously described second embodiment is modified such that a second bent portion 17 is further formed between the first bent portion 15 of the ultrapure water flow path 12 and the conductivity meter 14. This allows the dilute chemical solution S1 to be in a turbulent flow state in the second bent portion 17, and its concentration distribution becomes more homogenized. Thus, the error is reduced when measuring the conductivity of the dilute chemical solution S1 of ammonia using the conductivity meter 14 to calculate the concentration of ammonia based on the measured value; therefore, the plunger pump may be controlled using the control means, which is not illustrated, to slightly increase or decrease the supply amount of the chemical solution (ammonia solution) S, and the concentration of ammonia in the dilute chemical solution S1 can thereby be further stabilized.

In this case, the distance (t) between the first bent portion 15 and the second bent portion 17 may be preferably 20 to 50 cm because if the distance (t) is less than 20 cm, the effect of forming the second bent portion cannot be sufficiently obtained, while if the distance (t) exceeds 50 cm, the pipe becomes long and the dilute chemical solution production device 1 becomes large.

While the dilute chemical solution production device of the present invention has been described above based on the embodiments, the present invention is not limited to the above embodiments, and various modifications can be carried out. For example, the chemical solution S is not limited to the ammonia solution, and hydrochloric acid, sulfuric acid, hydrofluoric acid, nitric acid, carbonated water, which are acids, as well as an aqueous solution of potassium hydroxide and an aqueous solution of sodium hydroxide, which are alkalis, and the like can be used. In some cases, the present invention can also be applied to gas-dissolved water in which one or more gas components such as hydrogen, oxygen, and ozone are dissolved. Further, the conductivity measuring means may not have to be the conductivity meter 14, provided that the conductivity can be calculated, and the conductivity may be calculated from the reciprocal of the resistivity using a resistivity meter. Furthermore, the conductivity meter 14 may be provided with a separate flow path for measurement rather than being provided on the ultrapure water flow path 12. The pump is not limited to the plunger pump 4, and other liquid supply mechanisms such as a diaphragm pump may be applied. In each of the above-described embodiments, the case of using ultrapure water W has been described, but the embodiments can also be applied to pure water having a purity lower than that of ultrapure water W.

EXAMPLES

The present invention will be more specifically described with reference to the following example and comparative example. Note, however, that the present invention is not limited to these descriptions.

Example 1

Figure 4:
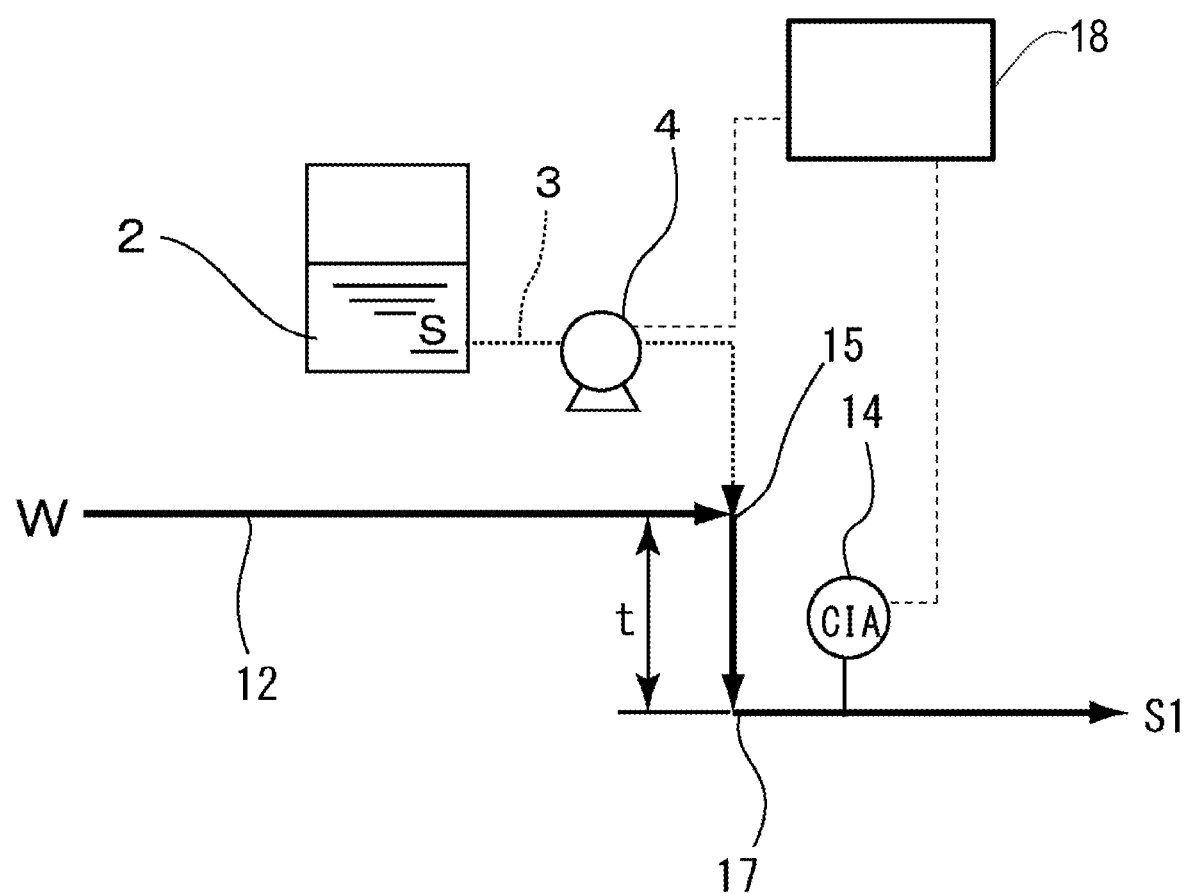
FIG. 4 is a schematic diagram illustrating an injection structure for the second liquid in the dilute chemical solution production device according to a third embodiment of the present invention.

Using the dilute chemical solution production device 1 illustrated in FIGS. 1 and 4, a dilute ammonia solution S1 was produced using an ammonia solution having a concentration of 29% as the undiluted solution of the chemical solution S. The distance (t) between the first bent portion 15 and the second bent portion 17 was set to cm, and the distance from the injection point (connection site) 11 to the conductivity meter 14 was set to 50 cm.

In this dilute chemical solution production device 1, the dilute chemical solution S1 was produced through setting the flow volume of the ultrapure water W to about 26 L/min with an ammonia set concentration of 30 ppm and supplying the ammonia undiluted solution S from the plunger pump 4 at an injection amount of 0.75 mL/min depending on the flow rate of the ultrapure water W.

Figure 5:
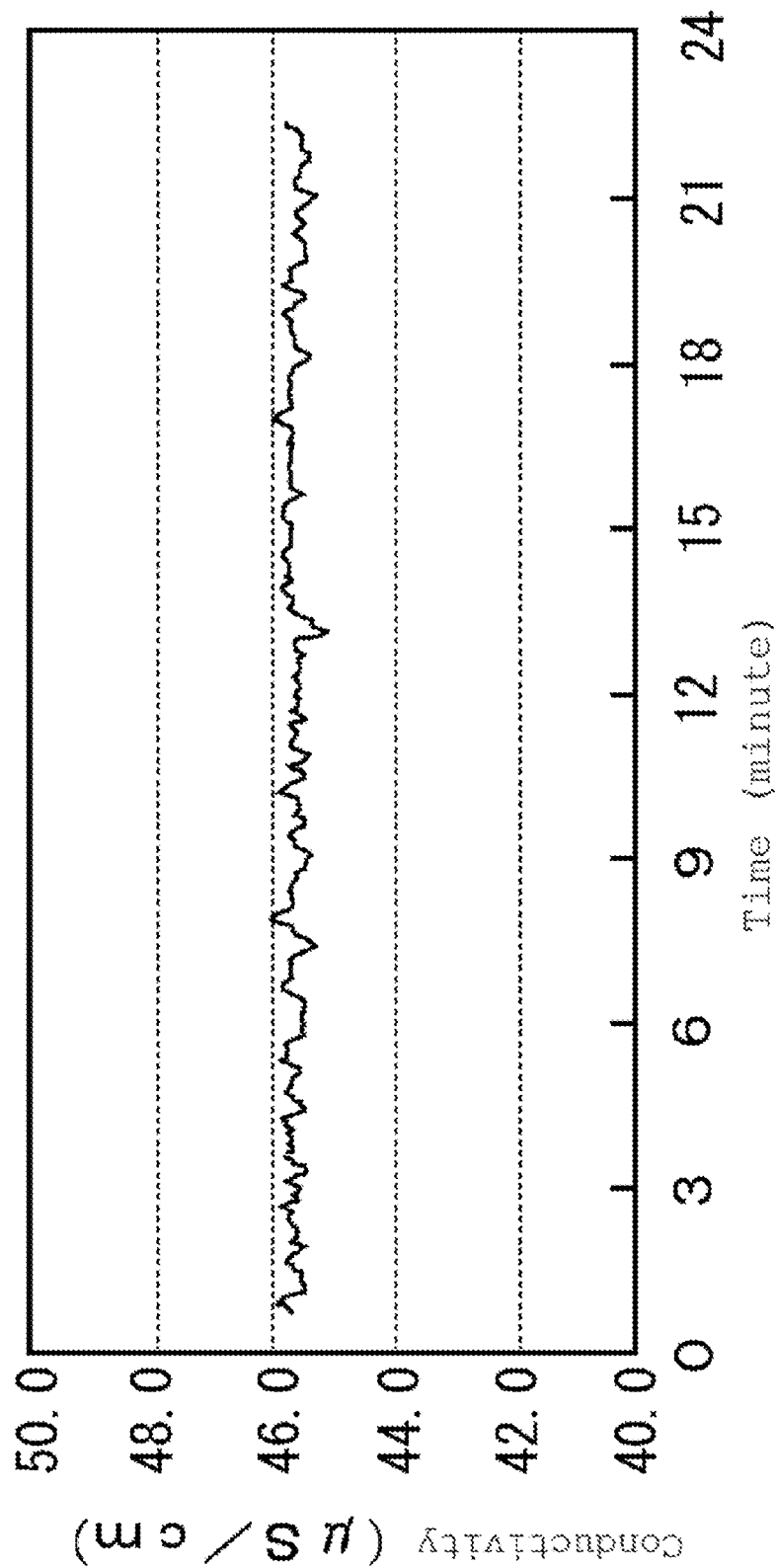
FIG. 5 is a graph illustrating the control of conductivity by the dilute chemical solution production device of Example 1.

In this operation, the preliminarily measured conductivity of the dilute chemical solution S1 having an ammonia concentration of 30 ppm was about 45.8 µS/cm, and the conductivity was therefore measured with the conductivity meter 14 to control the plunger pump 4 using the control means, which is not illustrated, with reference to the conductivity of 45.8 µS/cm. FIG. 5 illustrates the transition of the conductivity of the ammonia dilute chemical solution S1 during this operation in the dilute chemical solution production device 1.

When the ammonia dilute chemical solution S1 was produced by the dilute chemical solution production device 1 of Example 1, the plunger pump 4 was controlled using the conductivity meter 14, so that even when the flow volume of the ultrapure water W varied, the dilute chemical solution S1 was able to be produced stably with an ammonia concentration of about 30 ppm.

Comparative Example 1

Figure 6:
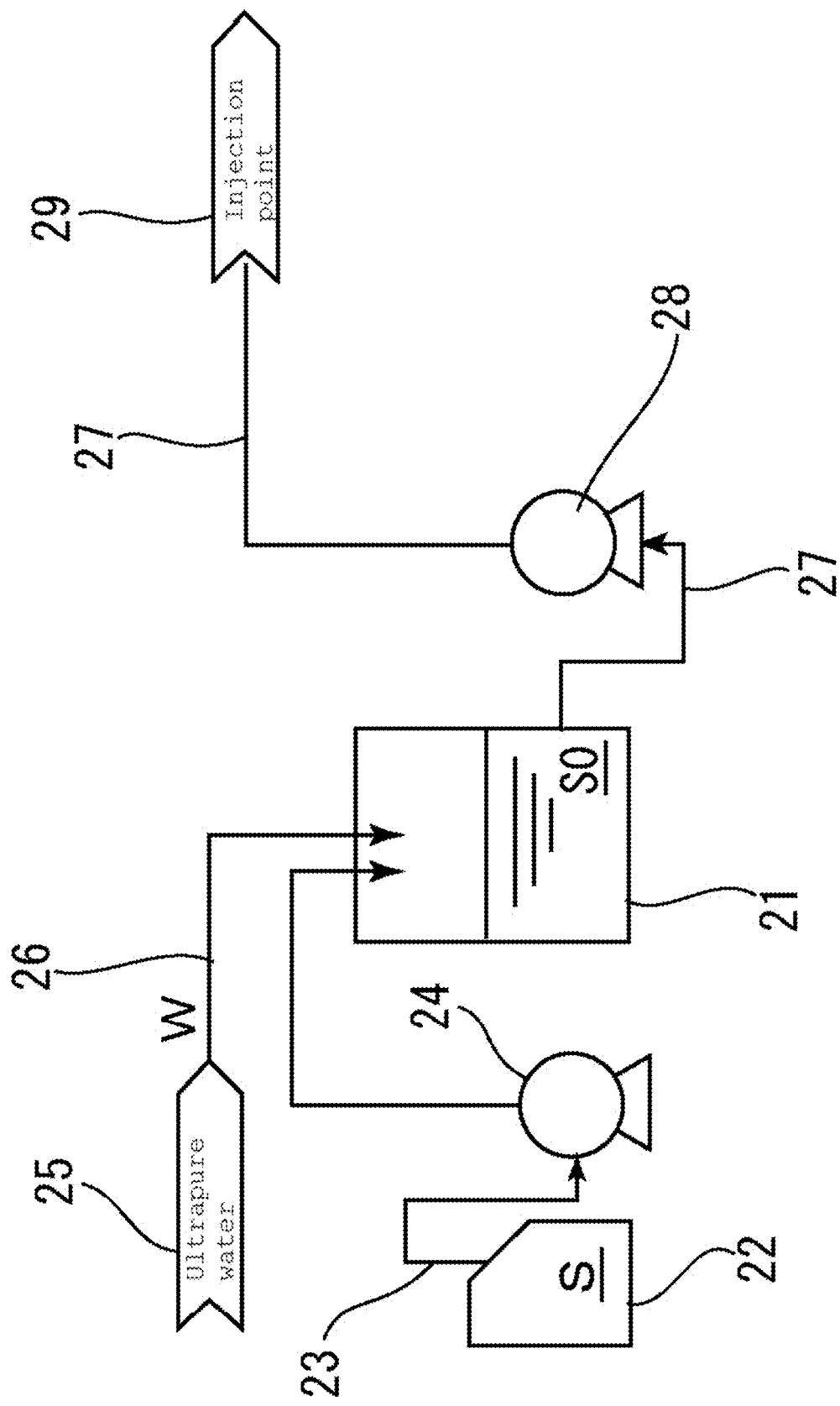
FIG. 6 is a flow diagram illustrating a conventional dilute chemical solution production device.
Figure 7:
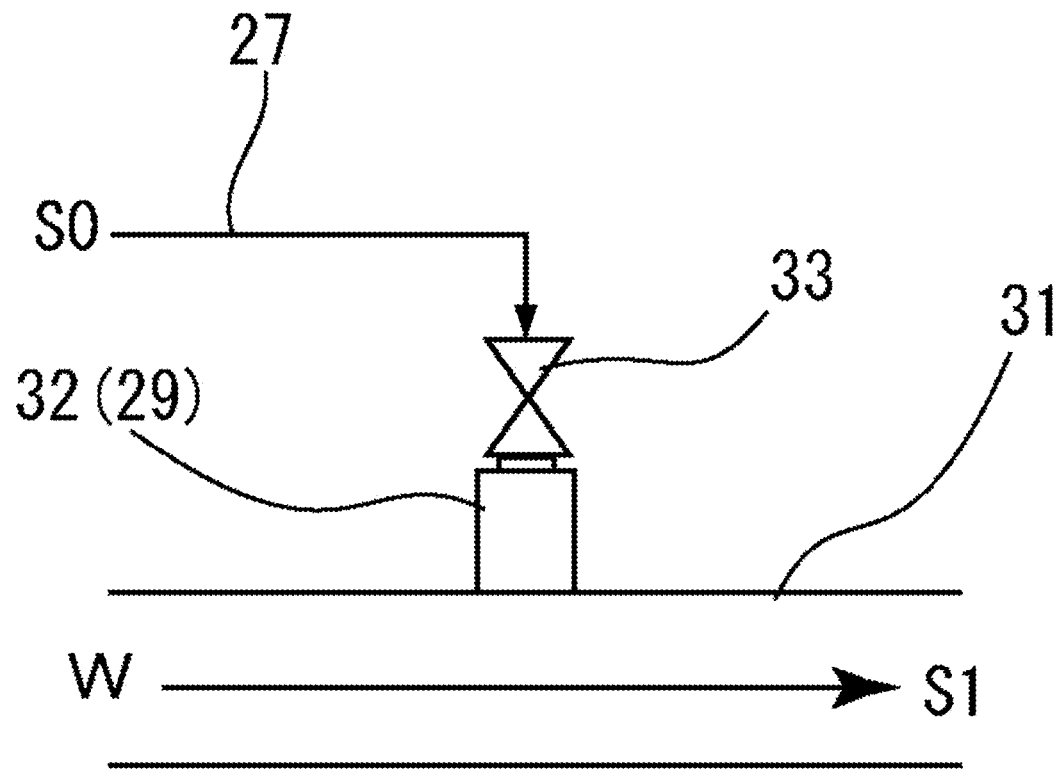
FIG. 7 is a schematic diagram illustrating an injection structure for the second liquid in the conventional dilute chemical solution production device.

Using the conventional dilute chemical solution production device illustrated in FIGS. 6 and 7, a dilute ammonia solution S1 was produced using an ammonia solution having a concentration of 29% as the undiluted solution of the chemical solution S.

In this dilute chemical solution production device, the dilute chemical solution S1 was produced through setting the flow volume of the ultrapure water W to 26 L/min with an ammonia set concentration of 30 ppm and supplying the ammonia undiluted solution S from the plunger pump 4 at an injection amount of 0.75 mL/min depending on the flow rate of the ultrapure water W.

When the ammonia dilute chemical solution S1 was produced by the dilute chemical solution production device of Comparative Example 1, the ammonia concentration of the dilute chemical solution S1 fluctuated from 27 to 33 ppm due to the fluctuation of the flow volume of the ultrapure water W.

DESCRIPTION OF REFERENCE NUMERALS

1 Dilute chemical solution production device
2 Chemical solution reservoir (undiluted solution tank)
3 Chemical solution supply pipe (second pipe)
4 Plunger pump (pump)
5 Chemical solution supply means
6 Purge gas supply means
7 First pressure gauge (pressure measuring means)
8 Drain pipe
9 Air vent valve (air vent mechanism)
10 Second pressure gauge (pressure measuring means)
11 Injection point
12 Ultrapure water flow path
13 Bore-through joint
14 Conductivity meter (conductivity measuring means)
15 First bent portion
16 Elbow member
17 Second bent portion
W Ultrapure water (first liquid)
S Chemical solution (second liquid: ammonia solution)
S1 Ammonia dilute chemical solution (dilute chemical solution)

The invention claimed is:

1. A dilute chemical solution production device that produces a dilute chemical solution of a second liquid by adding the second liquid to a first liquid, the dilute chemical solution production device comprising:
   a first pipe that flows the first liquid;
   an undiluted solution tank that stores the second liquid;
   a second pipe that connects the undiluted solution tank and the first pipe;
   a pump that adds the second liquid into the first pipe through the second pipe;
   a conductivity measuring meter provided on a downstream side of a connection site between the first pipe and the second pipe with respect to a flow direction of the first liquid; and
   a controller that controls the pump based on a measured value of the conductivity measuring meter,
   wherein the first pipe is provided with a first bent portion and a second bent portion, the first bent portion is disposed in a vicinity of the connection site with the second pipe, and the second bent portion is disposed between the first bent portion and the conductivity meter, and
   a distance between the first bent portion and the second bent portion is 20 to 50 cm.

2. The dilute chemical solution production device according to claim 1, wherein a tip of the second pipe is connected in a state of being inserted to an approximately central position with respect to an inner diameter of the first pipe.

3. The dilute chemical solution production device according to claim 2, wherein a distance between the connection site of the second pipe in the first pipe and the conductivity measuring meter is 30 to 70 cm.

4. The dilute chemical solution production device according to claim 2, wherein the first liquid is ultrapure water and the second liquid contains ammonia.

5. The dilute chemical solution production device according to claim 1, wherein a distance between the connection site of the second pipe in the first pipe and the conductivity measuring meter is 30 to 70 cm.

6. The dilute chemical solution production device according to claim 5, wherein the first liquid is ultrapure water and the second liquid contains ammonia.

7. The dilute chemical solution production device according to claim 1, wherein the first liquid is ultrapure water and the second liquid contains ammonia.

* * * * *